(12) United States Patent
Franceschini et al.

(10) Patent No.: US 9,037,930 B2
(45) Date of Patent: *May 19, 2015

(54) MANAGING ERRORS IN A DRAM BY WEAK CELL ENCODING

(71) Applicant: International Business Machines Corporation, Armonk, NY (US)

(72) Inventors: Michele M. Franceschini, White Plains, NY (US); Hillery C. Hunter, Deerfield, IL (US); Ashish Jagmohan, Irvington, NY (US); Charles A. Kilmer, Essex Junction, VT (US); Kyu-hyoun Kim, Mount Kisco, NY (US); Luis A. Lastras-Montano, Cortlandt Manor, NY (US); Moinuddin K. Qureshi, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 124 days.

This patent is subject to a terminal disclaimer.

(21) Appl. No.: 13/769,976

(22) Filed: Feb. 19, 2013

(65) Prior Publication Data

US 2014/0164692 A1 Jun. 12, 2014

Related U.S. Application Data

(63) Continuation of application No. 13/710,551, filed on Dec. 11, 2012, now Pat. No. 8,887,014.

(51) Int. Cl.
*G11C 29/00* (2006.01)
*G11C 11/406* (2006.01)
(Continued)

(52) U.S. Cl.
CPC .............. *G11C 29/70* (2013.01); *G11C 11/406*
(2013.01); *G11C 11/4076* (2013.01); *G11C 2211/4061* (2013.01); *G11C 2211/4062* (2013.01);
(Continued)

(58) Field of Classification Search
CPC ...... G11C 11/406; G11C 29/70; G11C 11/56; G11C 11/5621; G11C 11/5628; G11C 11/5642; G11C 16/10; G11C 16/3418; G11C 16/3431; G11C 16/3459; G11C 29/028; G11C 29/50; G11C 29/50004; G06F 11/1072; G01N 29/14
USPC ................... 714/6.11, 723; 711/106; 365/203
See application file for complete search history.

(56) References Cited

U.S. PATENT DOCUMENTS 4,736,344 A 4/1988 Yanagisawa
5,703,823 A 12/1997 Douse et al.
(Continued)

OTHER PUBLICATIONS

Borden et al., "On Coding for 'Stuck-at' Defects (Corresp).", IEEE Transactions on Information Theory, vol. 33, Issue 5, 1983. pp. 729-735. DOI: 10.1109/TIT.1987.1057347.
(Continued)

*Primary Examiner* — Guy Lamarre
(74) *Attorney, Agent, or Firm* — Richard A. Wilhelm; Robert R. Williams

(57) ABSTRACT

This disclosure includes a method for preventing errors in a DRAM (dynamic random access memory) due to weak cells that includes determining the location of a weak cell in a DRAM row, receiving data to write to the DRAM, and encoding the data into a bit vector to be written to memory. For each weak cell location, the corresponding bit from the bit vector is equal to the reliable logic state of the weak cell and the bit vector is longer than the data.

2 Claims, 6 Drawing Sheets

(51) Int. Cl.
  *G11C 11/4076* (2006.01)
  *G11C 29/02* (2006.01)
  *G11C 29/44* (2006.01)
  *G11C 11/40* (2006.01)

(52) U.S. Cl.
  CPC .............. *G11C11/40* (2013.01); *G11C 29/023* (2013.01); *G11C 29/028* (2013.01); *G11C 29/44* (2013.01); *G11C 2029/4402* (2013.01)

(56) References Cited

U.S. PATENT DOCUMENTS

| | | |
|---|---|---|
| 6,215,714 B1 | 4/2001 | Takemae et al. |
| 6,219,292 B1 | 4/2001 | Jang |
| 6,483,764 B2 | 11/2002 | Chen Hsu et al. |
| 6,618,314 B1 | 9/2003 | Fiscus et al. |
| 6,728,156 B2 | 4/2004 | Kilmer et al. |
| 6,920,523 B2 | 7/2005 | Le et al. |
| 7,095,669 B2 | 8/2006 | Oh |
| 7,206,244 B2 | 4/2007 | Cruz et al. |
| 7,233,538 B1 | 6/2007 | Wu et al. |
| 7,305,518 B2 | 12/2007 | Zeighami et al. |
| 7,444,577 B2 | 10/2008 | Best et al. |
| 7,461,320 B2 | 12/2008 | Klein |
| 7,515,494 B2 | 4/2009 | Butler |
| 7,526,713 B2 | 4/2009 | Klein |
| 7,565,479 B2 | 7/2009 | Best et al. |
| 7,734,866 B2 | 6/2010 | Tsern |
| 7,742,356 B2 | 6/2010 | Dono et al. |
| 7,818,651 B2 | 10/2010 | Nagai et al. |
| 8,264,903 B1 | 9/2012 | Lee et al. |
| 8,588,017 B2 | 11/2013 | Park et al. |
| 2002/0040417 A1 | 4/2002 | Winograd et al. |
| 2007/0104004 A1 | 5/2007 | So et al. |
| 2010/0318733 A1 | 12/2010 | Seo et al. |
| 2012/0051169 A1 | 3/2012 | Lee |
| 2014/0164820 A1* | 6/2014 | Franceschini et al. ........ 714/6.11 |

OTHER PUBLICATIONS

Heegard et al., "On the Capacity of Computer Memory with Defects", IEEE Transactions on Information Theory, vol. 29, Issue 5, 1983. pp. 731-739. DOI: 10.1109/TIT.1983.1056723.

Heegard, "Partitioned Linear Block Codes for Computer Memory with 'Stuck-at' Defects", IEEE Transactions on Information Theory. vol. 29, No. 6, Nov. 1983. pp. 831-842. DOI: 10.1109/TIT.1983.1056763.

Idei, Y. et al, "Dual-Period Self-Refresh Scheme for Low-Power DRAM's with On-Chip PROM Mode Register", IEEE Journal of Solid-State Circuits, Feb. 1998, pp. 253-259, vol. 33, No. 2. DOI: 10.1109/4.658627.

Kim, J., & Papaefthymiou, M., "Dynamic Memory Design for Low Data-Retention Power", Proceedings of the 10th International Workshop on Integrated Circuit Design, Power and Timing Modeling, Optimization and Simulation, PATMOS '00, in Lecture Notes in Computer Science, vol. 1918/2000 Springer-Verlag, 2000, pp. 207-216.

Kim, J., & Papaefthymiou, M., "Block-Based Multi-Period Refresh for Energy Efficient Dynamic Memory", 14th Annual IEEE International ASIC/SOC Conference 2001, Sep. 12-15, 2001. IEEE Issue 7 Aug. 2002. pp. 193-197. DOI: 10.1109/ASIC.2001.954696.

Kim, J., & Papaefthymiou, M., "Block-Based Multi-Period Dynamic Memory Design for Low Data-Retention Power", IEEE Transactions on Very Large Scale Integration (VLSI) Systems, Dec. 2003, pp. 1006-1018, vol. 11, No. 6. DOI: 10.1109/TVSLI.2003.817524.

Krishnamoorthy et al., "Error Control to Increase the Yield of Semiconductor RAM's", The 1998 IEEE/CAM Information Theory Workshop at Cornell, 1989. DOI: 10.1109/ITW.1989.761432.

Ohsawa et al., "Optimizing the DRAM Refresh Count for Merged DRAM/Logic LSIs", International Proceedings on Low Power Electronics and Design, 1998. pp. 82-87.

Seong et al., "SAFER: Stuck-At-Fault Error Recovery for Memories", 2010 43rd Annual IEEE/ACM International Symposium on Microarchitecture, 2010, pp. 115-124. DOI: 10.1109/MICRO.2010.46.

Venkatesan et al., "Retention-Aware Placement in DRAM (RAPID): Software Methods for Quasi-Non-Volatile DRAM", The 12th International Symposium on High Performance Computer Architecture, 2006. pp. 157-167. DOI: 10.1109/HPCA.2006.1598122.

U.S. Appl. No. 12/433,157, filed Apr. 30, 2009, "Increased Capacity Heterogeneous Storage Elements", Elfadel et al.

U.S. Appl. No. 12/553,400, filed Sep. 3, 2009, "Advanced Memory Device Having Improved Performance, Reduced Power and Increased Reliability", Chiu et al.

U.S. Appl. No. 12/814,142, filed Jun. 11, 2010, "Encoding Data Into Constrained Memory", Franceschini et al.

U.S. Appl. No. 12/963,797, filed Dec. 9, 2010, "Memory System With a Programmable Refresh Cycle", Kilmer et al.

\* cited by examiner

US 9,037,930 B2

MANAGING ERRORS IN A DRAM BY WEAK CELL ENCODING

CROSS-REFERENCE TO RELATED APPLICATIONS

This application is a continuation of co-pending U.S. patent application Ser. No. 13/710,551, filed Dec. 11, 2012. The aforementioned related patent application is herein incorporated by reference in its entirety.

FIELD OF INVENTION

This disclosure relates to DRAM error prevention. In particular, it relates to encoding rows of cells having weak cells for a fast read decode.

BACKGROUND

A dynamic memory cell stores a charge on a capacitor. The capacitor loses its charge over time and must be periodically refreshed. This refresh operation consumes resources and locks up the memory from performing other operations during the refresh, such as reading and writing. The frequency with which a particular capacitor will need refreshing depends on the construction and manufacture of the chip. On the same chip and often the same row, some capacitors may hold a charge on the order of milliseconds, while other capacitors may hold a charge on the order of seconds. If a cell does not hold its charge for a refresh cycle, it may be characterized as a weak cell.

SUMMARY

In an embodiment, this disclosure includes a method for preventing errors in a DRAM (dynamic random access memory) due to weak cells that includes determining the location of a weak cell in a DRAM row, receiving data to write to the DRAM, and encoding the data into a bit vector to be written to memory. For each weak cell location, the corresponding bit from the bit vector is equal to the reliable logic state of the weak cell and the bit vector is longer than the data.

In another embodiment, this disclosure includes a computer system that includes a memory controller coupled to a processor and to a DRAM (dynamic random access memory). The computer system is configured to determine the location of a weak cell in a DRAM row that can only hold one reliable logic state during a refresh interval. The memory controller is configured to receive data from the processor and encode the data into a bit vector to be written to memory. For each weak cell location, the corresponding bit from the bit vector is equal to the reliable logic state of the weak cell and the bit vector is longer than the data.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

DETAILED DESCRIPTION

Dynamic random access memory (DRAM) must be periodically refreshed, as the capacitors that store a charge in a DRAM cell may leak the charge over time. However, these capacitors do not all lose charge at the same rate or require refreshing at the same frequency. Due to manufacturing variations, some DRAM cells may leak or pick up charge at different rates than other cells. Rows having cells with capacitors poor at holding a charge must be refreshed at a faster rate than the majority of rows, which may have cells that are strong at holding a charge.

Traditionally, each row of the DRAM was refreshed at the refresh rate required for the weakest cells; this ensured that all the DRAM cells were refreshed before losing their charge. Refreshing DRAM consumes power and resources, and minimizing the total refresh time for the DRAM may reduce the power consumption of the DRAM and free up time and resources for reading and writing operations.

If a DRAM cell loses its charge before being refreshed at a particular refresh rate, it may be characterized as a weak cell. The weak cell is considered stuck at the value that it fails to; if the cell loses its charge, then the cell is considered stuck at zero. A cell that is stuck at one refresh rate may not be stuck at a faster refresh rate. However, as discussed above, it is advantageous for power management purposes to have as slow a refresh rate as possible. Dealing with weak cells so that they do not cause errors may enable slower refresh rates and less power consumption.

During a read operation of a DRAM, a read decoder may know the locations and values of the weak cells on a row from a test of the DRAM. However, the decoder must look up the locations and values for the weak cells, which may slow down the read operation of the DRAM.

According to embodiments of the invention, a DRAM may write data on to rows that may contain weak cells so that a read decoder may decode the data without having to access any weak cell information. Data to be written to a DRAM row may be encoded into a bit vector so that data bits of the bit vector are compatible with the weak cell values for the DRAM row. The bit vector may have an indicator that indicates to the read decoder the encoding operation that was performed. This indicator may enable the read decoder to know what decode operation to perform so that the row can be quickly decoded. The read decoder does not have to look up the locations and values of the weak cells, increasing the read latency.

Figure 2:
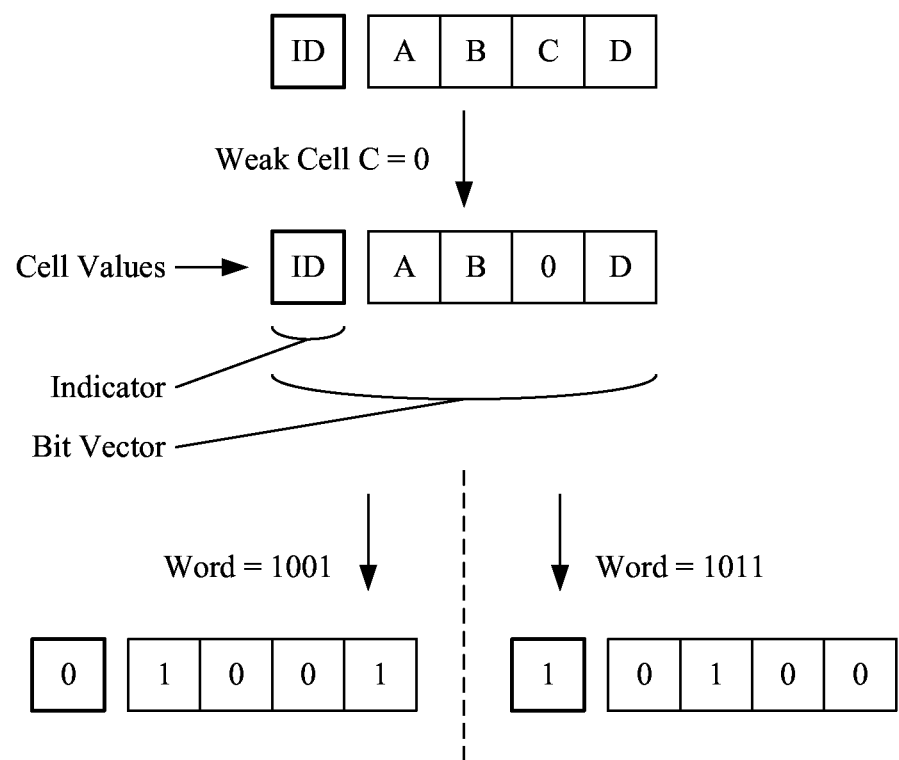
FIG. 2 is a diagram of weak cell encoding using an inversion method, according to the principles of the invention.

FIG. 2 is a diagram of weak cell coding for an optimized decode, according to the principles of the invention. A DRAM row may have one or more weak cells in the row. During encoding, the data may be manipulated with an encoding operation so that the resulting bit vector is compatible with the DRAM row's weak cell(s). The bit vector to be written to the DRAM row may contain an indicator and data. The indicator may contain information that indicates to the DRAM's read decoder the encoding operation that has been performed on the DRAM row so that the read decoder may quickly decode the data.

In the example of FIG. 2, data is encoded to a row by inverting the data. The row has a weak cell at C, which is stuck at zero i.e., is prone to leaking from a "one" to a "zero" at a particular refresh rate. If the data to be written to the DRAM row is "1001", the value corresponding to C is 0. This value is compatible with the weak cell value, where C is stuck at 0. The word may be encoded without inverting the data. The indicator may be set up so that a "0" in the indicator indicates no inverting operation has taken place and a "1" indicates that an inverting operation has taken place. Thus, the indicator may be a "0" for this example. If the data to be written is "1011", the value corresponding to C is "1." This value is not compatible with the weak cell value, where C is stuck at 0. The data may be encoded by inverting the data. The indicator may be a "1" to indicate to the read decoder that an inverting operation has taken place. The read decoder need only read the indicator to determine the coding operation and does not need to know the locations or values of the weak cells.

Method Structure

Figure 1:
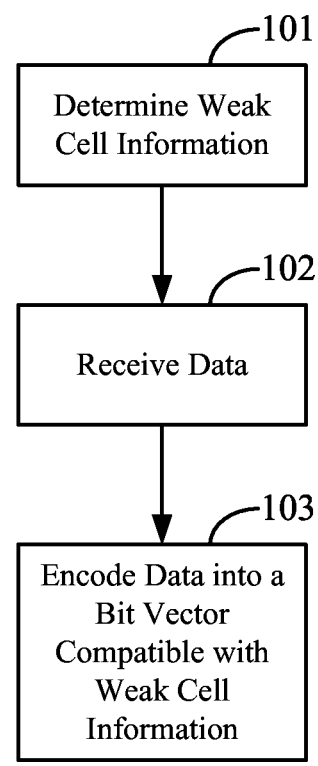
FIG. 1 is a diagrammatic representation of a method for performing weak cell encoding for an optimized decode, according to embodiments of the invention.

FIG. 1 is a diagrammatic representation of a method for performing weak cell encoding for an optimized decode, according to embodiments of the invention. The locations and reliable logic values of weak cells are determined for a DRAM row, as in 101. If weak cell information is not known, then the weak cell determination may be performed at start-up or in periodic testing. If weak cell information is known, for example having been tested for by the manufacturer or in an earlier start-up, then the weak cell determination may involve retrieving the weak cell information. If the DRAM has multiple refresh rates, the refresh rate may be tuned for the occurrence of weak cells. The data to be written to the DRAM row may be compared to the DRAM row's weak cell values to determine the compatibility of the DRAM row's weak cell reliable logic states with the corresponding values in the data. Once compatibility is determined, the data may be encoded into a bit vector that is compatible with the DRAM row's weak cell information, as in 103. If the data is determined to be compatible with the DRAM row's weak cell values, the data may be encoded into a bit vector without manipulation, along with an indicator indicating that data manipulation was performed. If the data is not compatible with the DRAM row's weak cell values, the data may be manipulated and encoded into a bit vector, along with an indicator indicating the manipulation that was performed.

Weak Cell Determination

Figure 3A:
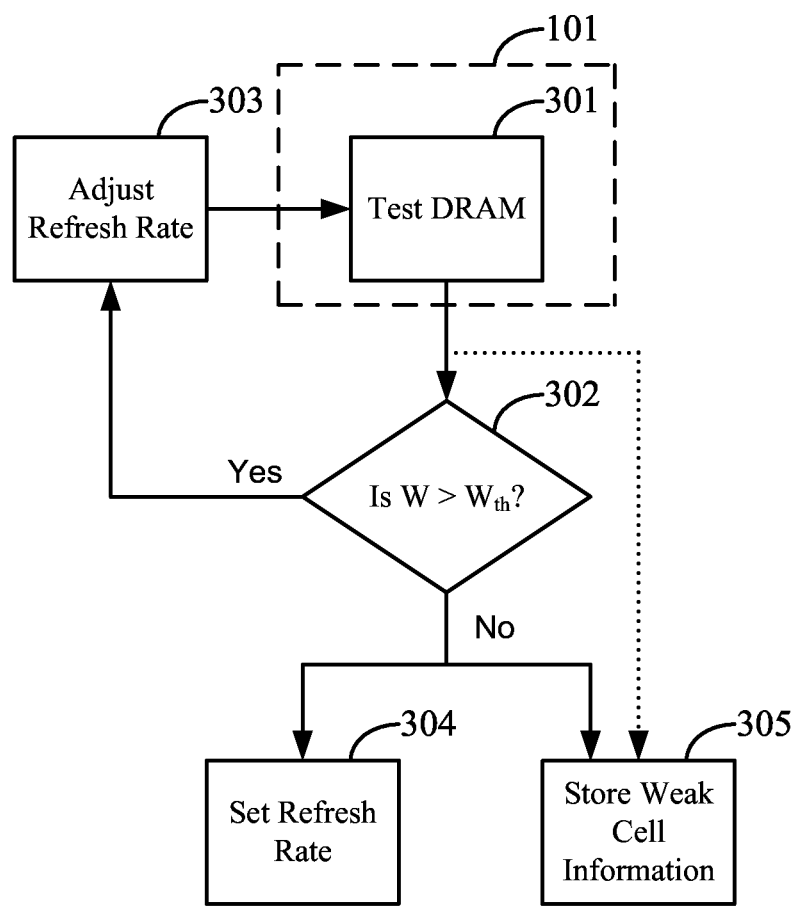
FIG. 3A is a diagrammatic representation of a method for determining weak cells in a DRAM row, according to embodiments of the invention.

FIG. 3A is a diagrammatic representation of a method for determining weak cells in a DRAM row, according to embodiments of the invention. A DRAM may be tested for weak cells at a predetermined refresh rate, as in 301. This test may include writing a bit pattern to a row, waiting a refresh interval, and determining which cells are weak and in which direction the weak cells fail for that predetermined refresh rate. The logic state to which a weak cell leaks may be referred to herein as the weak cell's reliable logic state. The weak cell information may be stored, as in 305.

In alternative embodiments, if the DRAM has multiple refresh rates, the refresh rate may be tuned for the occurrence of weak cells. The occurrence of weak cells (W) at a particular refresh rate may be evaluated against a weak cell threshold ($W_{th}$) to determine whether the refresh rate allows an acceptable number of errors, as in 302. For example, if a DRAM has ECC, it may be able to correct a first number of errors so that a second number of errors may be prevented by the DRAM's weak cell encoding method. For operations that require a higher accuracy, it may be desired to have a lower occurrence of weak cells. The threshold of weak cells may be the probability of rows on the DRAM having more than a certain number of weak cells, such as 99.9% of all rows having one weak cell or less. Alternatively, the threshold for weak cells may be probability of rows on the DRAM having weak cells that fail in more than one direction i.e., a weak cell that fails to one and a weak cell that fails to zero. Other thresholds are possible, depending on the reliability of the operation.

If the occurrence of weak cells is higher than the maximum allowed occurrence of weak cells, then the refresh rate may be adjusted so that the occurrence of weak cells is lower, as in 303. Once the weak cell occurrence is below the threshold, the refresh rate may be set, as in 304. Alternatively, if the occurrence of weak cells is below the threshold, the refresh rate may be decreased, in order to achieve an optimized refresh rate for saving power and resources.

According to embodiments of the invention, weak cell testing may be performed at various times. Weak cell information may be determined on a scheduled basis, such as during manufacturing at the time of testing the DRAM, in post-module assembly, or at system boot time. Additionally, weak cell information may be determined periodically, such as when data errors reach a threshold. The temperature and chip conditions may vary as the chip operates, so periodic testing may account for variability in these conditions.

Data Compatibility Determination and Bit Vector Encode

Figure 3B:
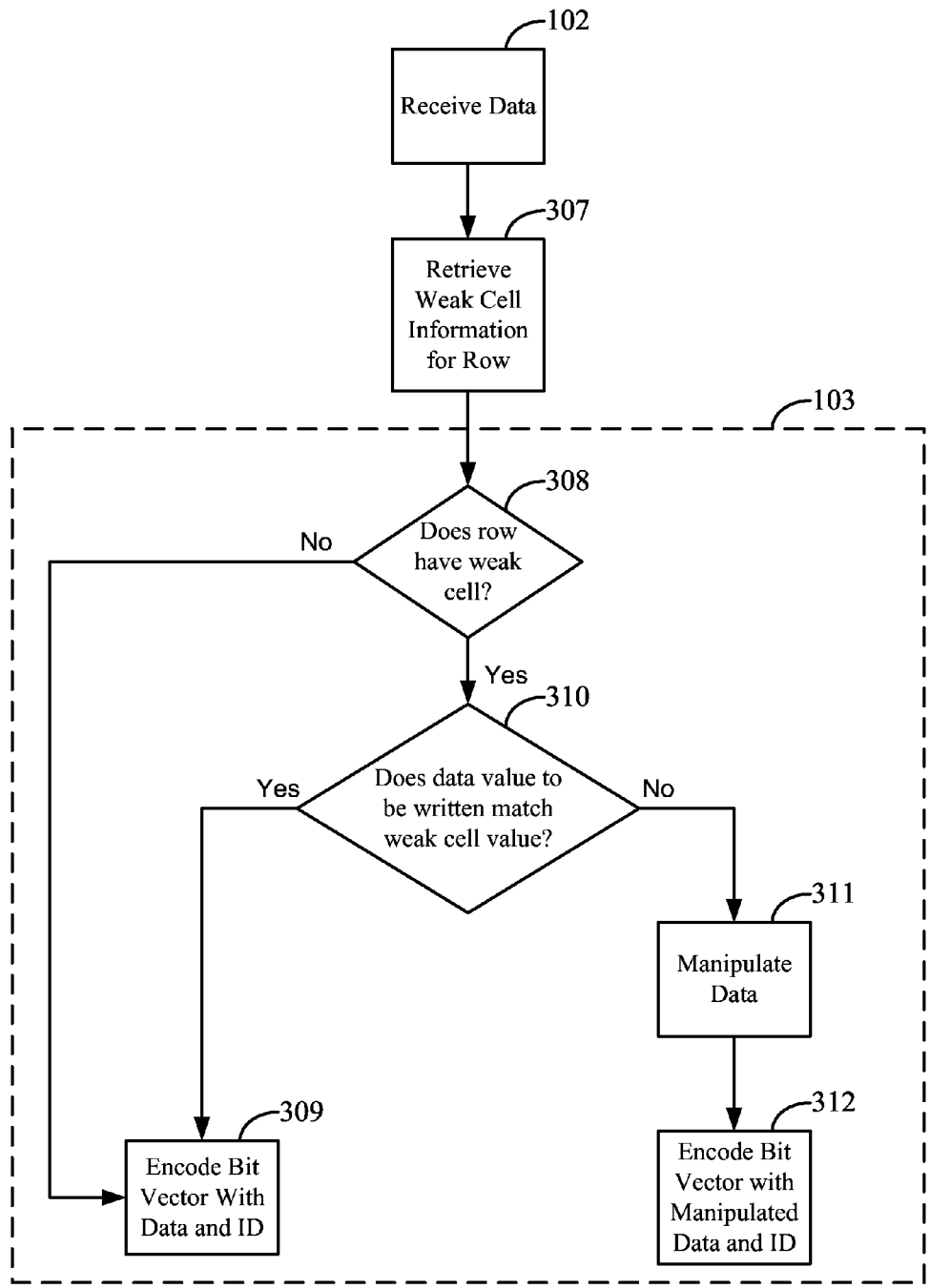
FIG. 3B is a diagrammatic representation of a method for determining data compatibility with a row's weak cell values and encoding a bit vector with the data, according to embodiments of the invention.

FIG. 3B is a diagrammatic representation of a method for determining data compatibility with a row's weak cell values and encoding the data and an indicator into a bit vector, according to embodiments of the invention. Data is received, as in 306. Weak cell information for the row may be retrieved, as in 307.

Logic associated with the DRAM determines whether the row has a weak cell and the reliable logic state of the weak cell, as in 308. If the row does not have a weak cell, then the DRAM may encode the data into a bit vector and encode an indicator (ID) into the bit vector that indicates no manipulation has been performed, as in 309. If the row has a weak cell, the DRAM encoder may compare the weak cell's value (reliable logic state) to the value at the corresponding location on the data to be written to the row, as in 310. If the data's bit value is the same as the weak cell's stuck value, then the DRAM may encode the data into a bit vector and encode an indicator (ID) into the bit vector that indicates that no manipulation has been performed, as in 309. If the data's bit value is the inverse of the weak cell's reliable logic state, then the DRAM may manipulate the data so that the data's bit value is the same as the weak cell's stuck value, as in 311. The DRAM may encode the manipulated data into a bit vector and encode an indicator (ID) into the bit vector that indicates the manipulation that was performed, as in 312.

In an embodiment of the invention, the encoding operation involves inverting data if the data bit value does not match the weak cell's reliable logic state. If a weak cell is present on a row and a value to be written to the row matches the weak cell's stuck value, the DRAM may encode the data into a bit vector without inverting the word and encode an indicator into the bit vector that is a first logical value, such as a "zero." If the data bit value does not match the weak cell's reliable logic state, the DRAM may invert the data, encode the data into a bit vector, and encode an indicator into the bit vector that is the inverse of the first logical value, in this case a "one." There may be a single weak cell in each DRAM row, or there may be multiple weak cells, so long as the word to be written is compatible with the weak cells' stuck values of the DRAM row. See FIG. 2 above for an example of the inverse encoding operation.

Read Decode

Figure 3C:
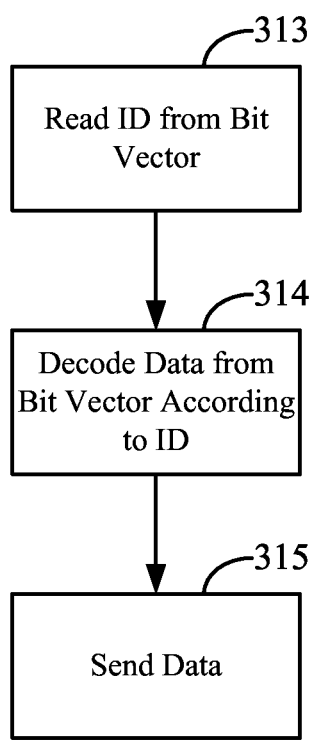
FIG. 3C is a diagrammatic representation of a method for decoding data involving reading an indicator to determine the encoding operation that was performed, according to embodiments of the invention.

FIG. 3C is a diagrammatic representation of a method for decoding data involving reading a indicator to determine whether an encoding operation was performed and if so, which encoding operation was performed, according to embodiments of the invention.

A DRAM decoder reads an indicator (ID) from a DRAM row, as in 313. The DRAM decoder decodes data from the bit vector based on the indicator, as in 314. If the indicator indicates that no manipulation was performed, then the decoder performs the corresponding decode on the data from the bit vector according to the indicator and sends the data, as in 315. If the indicator indicates a data manipulation that was performed, the decoder performs a corresponding decode of the data from the bit vector according to the indicator to construct the original data. The data may then be sent, as in 315. The read decoder only applies a decode operation according to the indicator and does not need to know the locations and values of the weak cells on the row.

Hardware Implementation

Figure 4:
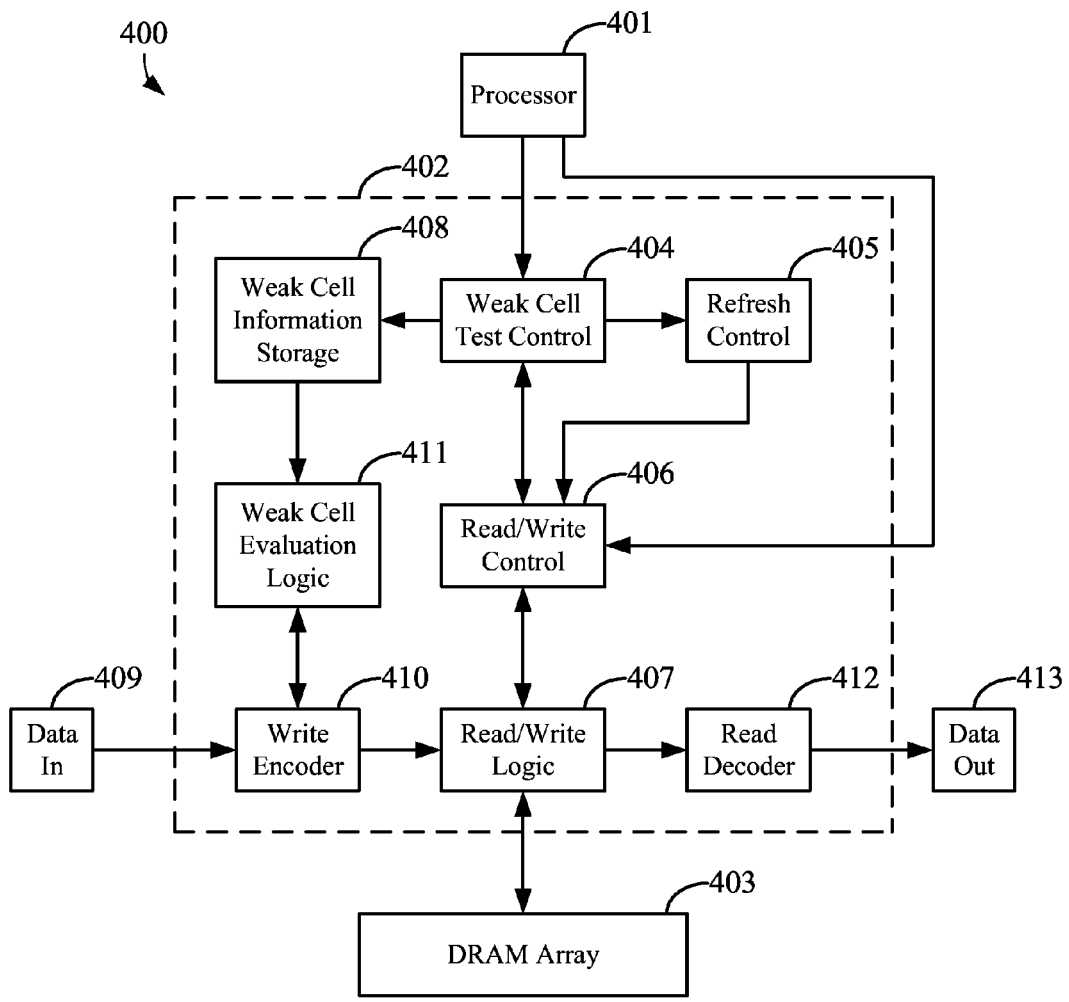
FIG. 4 is a diagrammatic representation of a hardware context 400 for implementing weak cell data encoding, according to embodiments of the invention.

FIG. 4 is a diagrammatic representation of a hardware context 400 for implementing weak cell encoding, according to embodiments of the invention. A processor 401 initiates a test of the DRAM array 403 at the memory controller 402. The processor 401 sends a signal to the weak cell test control 404, to signal the read/write test control 404 to test the DRAM array 403. The read/write logic 407 writes a test pattern to the DRAM array 403, waits for a refresh period, and reads the DRAM array 403. The weak cell test control 404 evaluates whether the number of weak cells are acceptable for the row or DRAM as a whole. If the number of weak cells is not acceptable, the refresh control 405 changes the refresh rate and the DRAM array 403 is tested until it achieves satisfactory results. If the number of weak cells is acceptable, the weak cell information for the row of the DRAM array 403 may be stored in the weak cell information storage 408.

When data is to be written to a row in the DRAM array 403, data is sent from a data in 409 to a write encoder 410. Weak cell evaluation logic 411 retrieves the weak cell information for the row from weak cell information storage 408. The weak cell evaluation logic 411 compares the weak cells to the corresponding locations in the data to be written from the data in 409. If there are no weak cells in the row or the values of the weak cells are the same as the values of the corresponding locations in the data, the write encoder 410 encodes the data without manipulation and an indicator indicating that no encoding operation has been performed into a bit vector, and sends a signal to the read/write logic 407 to write the bit vector to the row. If the values of the weak cells are not the same as the values of the corresponding locations in the data, the write encoder 410 manipulates the data so that the data is compatible with the weak cells on the row. The write encoder 410 encodes the data and an indicator that indicates the encoding operation that was performed on the data into a bit vector, and sends a signal to the read/write logic 407 to write the bit vector to the row.

When data is read from a row in the DRAM array 403, the read/write control 406 signals the read/write logic 407 to read the bit vector from the row in the DRAM array 403. The bit vector is decoded by a read decoder 412 and includes an indicator and the word data. If the indicator indicates that no data manipulation was performed, the data is decoded and sent to data out 413 without any data manipulation. If the indicator indicates a data manipulation was performed, the data is decoded according to the indicator to construct the original data and the data sent out.

In another embodiment, a method for performing a weak cell encode and decode may be implemented with discrete hardware or firmware components. The weak cell encode and decode method discussed above may be achieved through logic circuits or programmable devices, such as programmable logic arrays (PLA) or application specific integrated circuits (ASIC). The firmware may be present on-board a DRAM or off-board. The functions of the weak cell encode and decode method may be performed through a combination of hardware and firmware.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. A computer system comprising:
   a memory controller coupled to a processor and to a DRAM (dynamic random access memory);
   wherein the computer system is configured to determine the location of a weak cell in a DRAM row that can only hold one reliable logic state during a refresh interval; and
   wherein the memory controller is configured to:
   receive data from the processor,
   encode the data into a bit vector to be written to memory, wherein:
   for each weak cell location, the corresponding bit from the bit vector is equal to the reliable logic state of the weak cell; and
   the bit vector is longer than the data.

2. The computer system of claim 1, wherein:
   the computer system is configured to store the location and reliable logic state of the weak cell; and
   the bit vector further comprises an indicator that indicates to a read decoder the encoding operation performed on the data to create the bit vector.

* * * * *